United States Patent
Arao et al.

(12) 
(10) Patent No.: US 6,471,848 B1
(45) Date of Patent: *Oct. 29, 2002

(54) ELECTRODEPOSITION METHOD OF FORMING AN OXIDE FILM

(75) Inventors: Kozo Arao, Nara; Noboru Toyama, Hirakata; Yuichi Sonoda, Nara; Yusuke Miyamoto, Kyotanabe, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,891

(22) Filed: Feb. 12, 1999

(30) Foreign Application Priority Data

Feb. 17, 1998 (JP) ............................................. 10-034443
Feb. 17, 1998 (JP) ............................................. 10-034446

(51) Int. Cl.[7] .................................................. C25D 5/48

(52) U.S. Cl. ...................... 205/220; 205/199; 205/138; 205/333; 205/917; 427/255.18; 438/758

(58) Field of Search ................................. 204/206, 207; 205/220, 138, 141, 320, 333, 199, 917; 427/255.18, 255.22; 438/758

(56) References Cited

U.S. PATENT DOCUMENTS

| 4,124,454 | A | * | 11/1978 | Shang | 205/89 |
| 4,388,169 | A | * | 6/1983 | Nagira et al. | 204/207 |
| 5,800,632 | A | | 9/1998 | Arao et al. | 136/258 |
| 5,804,466 | A | * | 9/1998 | Arao et al. | 438/95 |
| 5,855,856 | A | * | 1/1999 | Karlson | 422/186.11 |
| 6,077,411 | A | * | 6/2000 | Nakamura | 205/138 |

FOREIGN PATENT DOCUMENTS

JP  09092861  4/1997

* cited by examiner

*Primary Examiner*—Nam Nguyen
*Assistant Examiner*—Wesley A. Nicolas
(74) *Attorney, Agent, or Firm*—Fitzpatrick, Cella, Harper & Scinto

(57) ABSTRACT

This invention provides an electrodeposition apparatus, comprising at least one electrodeposition vessel for supplying a current between a substrate and an electrode in an electrodeposition bath to form an oxide film or the substrate and a rinsing means for rinsing the substrate after passing the electrodeposition tank with water, wherein a humidifying means for preventing drying of at least the film forming surface of the substrate is provided along the transporting path of the substrate at least at the exit side of the electrodeposition vessel and an oxide film forming method. Thus a uniform oxide film without unevenness can be formed on the substrate.

43 Claims, 3 Drawing Sheets

ELECTRODEPOSITION METHOD OF FORMING AN OXIDE FILM

BACKGROUND OF THE INVENTION

1. Field of the Invention

The present invention relates to an electrodeposition apparatus and an oxide film forming method for forming an oxide film by electrodeposition (which includes electrolytic plating and electrolytic deposition, both having the same meaning) on a long substrate such as a stainless steel belt-like plate, and more particularly to an electrodeposition apparatus and an oxide film forming method for uniformly forming a zinc oxide film on the substrate.

2. Related Background Art

In the production of photovoltaic elements, the technology of forming oxide on a substrate by an electrochemical reaction in an aqueous solution is being investigated as an atternative the vacuum process. For example, the Japanese Patent Laid-Open Application No. 09-092861 proposes "a method of producing a photovoltaic element" and discloses "a method of forming an oxide such as zinc oxide on a long substrate by electrodeposition and an apparatus therefor".

FIG. 2 is a schematic view showing an example of the apparatus for forming an oxide by electrodeposition, which was prepared by modifying the apparatus described in the above-mentioned patent application by the present inventors, and simplified to function only to form a zinc oxide film by electrodeposition. The apparatus shown in FIG. 2 does not constitute the prior art.

In FIG. 2, a long substrate 2001 of stainless steel is fed from a rolled stainless steel sheet, which is also called a hoop material, a roll-type substrate or a web. The long substrate 2001 is transported to the apparatus in the state of a coiled substrate, wound on a bobbin.

In the present apparatus, the coiled long substrate 2001 is mounted on a substrate feeding roller 2002. While an interleaving paper inserted for surface protection is wound up on a interleaf wind-up roller 2003, the substrate is transported as indicated by an arrow 2004 toward a substrate wind-up roller 2062 and wound thereon as indicated by an arrow 2061.

In the transporting path, the substrate 2001 passes through a tension detecting roller 2005 and an electric power supplying roller 2006 an enters and electrodeposition vessel 2009. In the vessel 2009, the substrate 2001 is positioned by supporting rollers 2013 and 2014 and is subjected to the formation of an oxide film by electrodeposition.

After passing the electrodeposition vessel 2009, the substrate 2001 is introduced into a rinsing vessel 2030 and washed therein. The substrate is positioned in the rinsing vessel 2030 by supporting rollers 2031 and 2066. After passing the rinsing vessel 2030, the substrate 2001 is introduced into a hot air drying oven 2051 and dried therein.

After passing the drying oven 2051, the substrate 2001 passes through a supporting roller 2057, then is subjected to the correction of lateral displacement by a skew correcting roller 2059 and is wound on the substrate wind-up roller 2062 together with a new interleaving paper supplied from an interleaf feeding roller 2060. Then the substrate is transported to a next step when required.

The tension detecting roller 2005 detects the dynamic tension of the substrate 2001 and applies a feedback to braking means such as a powder clutch (not shown in the drawings) linked to the shaft of the substrate feeding roller 2002, thereby maintaining a constant tension. Thus, the transporting path of substrate 2001 is designed so as to have a predetermined tension value between the supporting rollers.

In particular, in the present apparatus in which the film forming surface of the substrate is free from contact with the rollers, weak tension may result in various defects such as disengagement of the substrate 2001 from the supporting rollers or hanging of the substrate 2001 at the entrance or exit of the electrodeposition vessel 2009 or the rinsing vessel 2030, leading to the damage on the substrate by frictional contact thereof. Consequently the tension detecting roller 2005 is an important member.

The configuration in which the apparatus does not contact the film forming surface has the advantages that the film forming surface is free from damage or smear and is particularly advantageous for an application in which irregularities in size on the order of several microns have to be formed on a thin film, as in the case of the reflection film of a solar cell.

An electric power supplying roller 2006 for serving to supply a cathodic potential to the long substrate is positioned as close as possible to the electrodeposition bath and is connected to the negative electrode of a power source 2008.

The electrodeposition vessel 2009 serves to hold the electrodeposition bath 2016, to determine the path of the substrate 2001 and to support an anode 2017 so as to oppose to the substrate 2001. The anode 2017 is connected via an electric power supplying bar 2015 to the positive electrode of the power source 2008, and a positive voltage is applied to the anode 2017. Thus there is executed an electrochemical electrodeposition process in the electrodeposition bath, with the substrate 2001 as the negative side and the anode 2017 as the positive side.

When the electrodeposition bath 2016 is maintained at a high temperature, there is generated a considerable amount of water vapor and vapor exhausting dusts 2010, 2011 and 2012 are used to remove the water vapor.

Also, in order to agitate the electrodeposition bath 2016, air is introduced from an agitating air introduction pipe 2019 and bubbling is executed by blowing air from an air blow pipe 2018 in the electrodeposition vessel 2009.

For supplying a high temperature bath to the electrodeposition vessel 2009, a heater 2024 is provided in an electrodeposition circulating vessel 2025 for heating an electrodeposition bath solution and the heated solution is supplied to the electrodeposition vessel through a circulating pump 2023 and an electrodeposition bath solution supply pipe 2020. The solution overflowing from the electrodeposition vessel 2009 and a part of the solution to be positively circulated are returned through a feedback path (not shown in the drawings) to the circulating vessel 2025 and are heated again therein.

In case the discharge amount of the pump 2023 is constant, the amount of the solution supplied from the circulating vessel 2025 to the electrodeposition vessel 2009 can be controlled by valves 2021 and 2022. In order to increase the supply amount, the valve 2021 is opened more while the valve 2022 is closed more, and vice versa. The level of the electrodeposition bath 2016 is adjusted by such a supply amount and the feedback amount from the feedback bath.

The circulating vessel 2025 is provided with a filter circulating system consisting of a circulating pump 2027 and a filter, in order to remove particles in the circulating vessel 2025. If the supply and feedback amounts of the solution between the circulating vessel 2025 and the electrodeposition vessel 2009 are sufficiently large, satisfactory removal of the particles can be achieved by positioning the filter solely in the circulating vessel 2025.

In the present apparatus, the circulating vessel 2025 is also provided with a vapor exhausting duct 2026 for removing the vapor. Since the circulating vessel 2025 constitutes a heat source by arranging the heater 2024 therein, there is generated a significant amount of vapor and such vapor removal is very effective in case unexpected release or condensation of thus generated vapor is undesirable.

An electrodeposition reserve vessel 2029 is provided for preventing damage to a solution disposing unit which is caused by direct discharge of the heated solution to the solution disposing system, and can hold the electrodeposition bath 2016 of the electrodeposition vessel 2009 when the valve 2028 is opened, thereby evacuating the electrodeposition vessel 2009 and improving the efficiency of the work therein.

The substrate 2001 subjected to electrodeposition in the electrodeposition vessel 2009 is then introduced into the rinsing vessel system 2030 and washed therein. In the rinsing tank system 2030, the substrate 2001 is positioned by the supporting rollers 2031 and 2066 and passes the first rinsing vessel 2032, the second rinsing vessel 2033 and the third rinsing vessel 2034 in succession.

The rinsing vessels 2032 to 2034 are provided with water circulating vessels 2047 to 2049 and water circulating pumps 2044 to 2046, respectively. The water supply amounts to the rinsing vessels are determined by two valves 2038 and 2041; 2039 and 2042; and 2040 and 2043, respectively, and rinsing water is supplied into the rinsing vessels 2032 to 2034 through water supply pipes 2035 to 2037, respectively.

The control of the supply amount with two valves is similar to that in the electrodeposition vessel 2009. Also an overflowing water or feedback water (not shown in the drawings) which is a part of water to be positively returned may be returned to the circulating vessels 2047 to 2049 similarly to the case of the electrodeposition tank 2009.

In the three-step rinsing system as shown in FIG. 2, the rinsing water generally becomes clearer from the rinsing vessel at the upstream side in the substrate transporting direction toward than at the downstream side, namely from the first rinsing vessel 2032 toward the third rinsing vessel 2034. This indicates that the substrate 2001 clearer as it is transported toward the end of the rinsing process.

Based on this fact, the water usage can be significantly saved by feeding the rinsing water at first to the third rinsing vessel 2049, then feeding the water overflowing therefrom to the second rinsing vessel 2048 and feeding the water overflowing therefrom to the first rinsing vessel 2047.

The substrate 2001 after rinsing is subjected to removal of water by an air knife 2065 provided in a part of the rinsing vessel system 2030 and is then transported to the hot air drying oven 2051, in which drying is executed with convection air having a temperature sufficient for evaporating water. The convection air flow is supplied by blowing hot air which is generated in a hot air generating oven 2055 and passed via a filter 2054 for particle removal, from a hot air blow pipe 2052.

The overflowing air is recovered from a hot air recovery pipe 2053 and returned to the hot air generating oven 2055 after mixing with external air introduced from an external air introduction pipe 2056.

The transporting path of the substrate 2001 in the hot air drying oven 2051 is positioned by the supporting rollers 2066 and 2057.

The skew correction roller 2059 corrects the aberration of the substrate 2001 in the width direction of the substrate and feeds the substrate for winding on the wind-up roller 2062. The roller 2059 is controlled by rotating about an arm (not shown in the drawings) based on the amount of aberration detected by a sensor not shown in the drawings. Ordinarily the amount of aberration detected by the sensor and the amount of actuation of the skew correcting roller 2059 are both quite small and do not exceed 1 mm.

In winding up the substrate 2001, a new interleaving paper is supplied from the interleaf feed roller 2060 in order to protect the surface film.

Stoppers 2007 and 2058 function at the same time to support the substrate 2001 standstill under a tension in order to improve the work efficiency at the replacement of the substrate 2001 or at the maintenance of the apparatus.

The electrodeposition apparatus shown in FIG. 2 provides the following advantages.

Firstly, the film formation is much simpler in comparison with that in a vacuum apparatus such as a sputtering apparatus. There is not required an expensive vacuum pump, and there is also not required designing of the power source or electrode for using plasma.

Secondly, the running cost is lower in most cases. This is because the sputtering apparatus requires an expensive target due to its preparation using manpower and an additional apparatus and the efficiency of target utilization of generally 20% or lower. Therefore, the target replacement work is frequently conducted to reduce productivity in case the throughput of the apparatus or the film thickness is large.

It is also superior in the apparatus cost and the running cost of other methods such as CVD or vacuum evaporation.

Also, the formed film is composed of polycrystaline fine particles in most cases. It is comparable in the electrical conductivity and in the optical characteristics to the film obtained in the vacuum method and superior to the film obtained by the sol-gel method, coating method utilizing organic substances or spray pyrolysis method.

Furthermore, other than these advantages are also achieved in forming an oxide, such as ease of disposal of the used solution, little influence on the environment and a low cost required for preventing environmental pollution.

However, the film formation with the above-described electrodeposition apparatus has resulted in the following drawbacks.

More specifically, though the electrodeposition in the electrodeposition vessel 2009 is satisfactory, the formed film surface dries before reaching the rinsing vessel system 2030 because in the high solute concentration of the electrodeposition bath 2016 and the high bath temperature, thereby generating unevenness in the form of a vague undulating stripe pattern on the formed film surface after drying. For example, in the production of a solar cell such unevenness in the form of vague undulating stripe pattern still remains even after formation of a semiconductor electromotive layer composed mainly of amorphous silicon by CVD and of a transparent conductive layer such as ITO, and results in uneven portions.

SUMMARY OF THE INVENTION

The present invention is to provide an electrodeposition apparatus capable of uniformly electrodepositing a uniform oxide film on a substrate, thereby obtaining an oxide film suitable for, for example, the reflective layer of the solar cell.

The present invention is to provide an electrodeposition apparatus comprising at least one electrodeposition vessel for supplying a current between a substrate and an electrode in an electrodeposition bath to form an oxide film on the substrate and a rising means for rinsing the substrate with water after passing the electrodeposition vessel, wherein a humidifying means to prevent drying of at least the film forming surface of the substrate is provided along the transporting path of the substrate at least at the exit side of the electrodeposition vessel.

Also the present invention is to provide an electrodeposition apparatus comprising at least one electrodeposition vessel for supplying a current between a substrate and an electrode in an electrodeposition bath to form an oxide film on the substrate and a rising means for rinsing the substrate with water after passing the electrodeposition vessel, wherein the substrate after the is then transported into another electrodeposition vessel or a rinsing means before the substrate surface is dried spontaneously to deposit the solute in the electrodeposition bath.

Further, the present invention is to provide a method of forming an oxide film, which comprises supplying a current between a substrate and an electrode in an electrodeposition bath of at least one electrodeposition vessel to form an oxide film on the substrate and rinsing the substrate after passing the electrodeposition vessel with water by a rinsing means, wherein at least the film forming surface of the substrate is humidified by a humidifying means along the transporting path of the substrate at least at the exit side of the electrodeposition vessel.

Furthermore the present invention is to provide a method of forming an oxide film, which comprises supplying a current between a substrate and an electrode in an electrodeposition bath of at least one electrodeposition vessel to form an oxide film on the substrate and rinsing the substrate after passing the electrodeposition vessel with water by a rinsing means, wherein the substrate after passing the electrodeposition vessel is transported to another electrodeposition vessel or a rinsing means before the substrate surface is dried spontaneously to deposit the solute in the electrodeposition bath.

By maintaining the substrate in a superhumidified state with such humidifying means, the solution transferred from the electrodeposition vessel to the substrate surface is prevented from drying, and the substrate in the humidified state is transported into the rinsing vessel, whereby the solute is not deposited to generate the unevenness of the film forming surface.

When the temperature of the electrodeposition bath is higher than room temperature, the transporting path between the electrodeposition vessel and the rinsing means may be covered by the enclosing means to maintain the interior thereof in a superhumidified state, whereby drying of the substrate resulting from the elevated substrate temperature can be prevented.

Such enclosing means may be composed of a water jacket to lower the ambient temperature, whereby the present invention becomes applicable even to an oxide sensitive to the temperature.

Also when several rinsing vessels are provided as the rinsing means and the temperature of the rinsing water is high to easily dry the substrate surface in the transporting path, the above-described humidifying means is provided between the rinsing vessels. The humidifying means can prevent formation of unevenness during film forming, and it also can enhance the rinsing effect by maintaining the rinsing water at a high temperature even when the electrodeposition bath contains a saccharide such as sucrose.

The humidifying means (liquid scattering means) includes a liquid mist spraying device, a device for generating small liquid droplets by utilizing the vibration of an ultrasonic vibrator, a humidifier utilizing a piezoelectric element, or a water vapor generating device.

When the humidifying means is composed of a device for generating small liquid droplets by utilizing the vibration of an ultrasonic vibrator, it is preferable that the vibration surface of the ultrasonic vibrator is inclined with respect to the film forming surface of the substrate and that the vibrator is provided with an ultrasonic power source for generating an ultrasonic wave in synchronization with the transportation of the substrate, liquid supply means for supplying a humidifying liquid to the vibration surface of the vibrator, liquid recovery means for recovering the humidifying liquid not formed into liquid droplets, and the circulating means for circulating the humidifying liquid from the liquid recovery means to the liquid supply means.

The humidifying liquid is preferably composed of water, a solution of the same composition as that of the preceding electrodeposition bath or a mixture of the solution and water.

In order to prevent metal deposition in the electrodeposition bath, it is preferably maintained at 60° C. or higher.

In particular, the electrodeposition bath of 80° C. or higher enables stable film formation in an electrodeposition process requiring a high temperature for zinc oxide or the like.

Also when the substrate is composed of a ferromagnetic material, magnet rollers in contact with the upper surface of the substrate as the transporting means are used to avoid vertical movement thereof in the overflowing portion, thereby preventing formation of the unevenness resulting from liquid overflowing or liquid splashing.

Furthermore, extremely stable formation of a zinc oxide film by electrodeposition can be executed when the oxide film formed in the electrodeposition bath is zinc oxide, the solution medium is water and the solute to be deposited by drying is zinc nitrate.

For achieving uniform oxide film formation, the electrodeposition bath preferably contains a saccharide.

Furthermore, with the transporting means composed of the rollers in contact with the substrate surface, the transporting direction of the substrate is not limited to horizontal, significantly broadening the freedom in designing the entire electrodeposition apparatus.

DESCRIPTION OF THE PREFERRED EMBODIMENTS

In the following, the constitution and effect of the present invention, as well as the history of arriving at the present invention will be explained. The present inventors have investigated the unevenness of the vague undulating stripe pattern by the following experiments.

The present inventors have found that the formation of the unevenness can be eliminated by mist spraying or by prevention of drying in the substrate transporting path between the electrodeposition vessel 2009 and the rinsing vessel system 2030.

Figure 3:
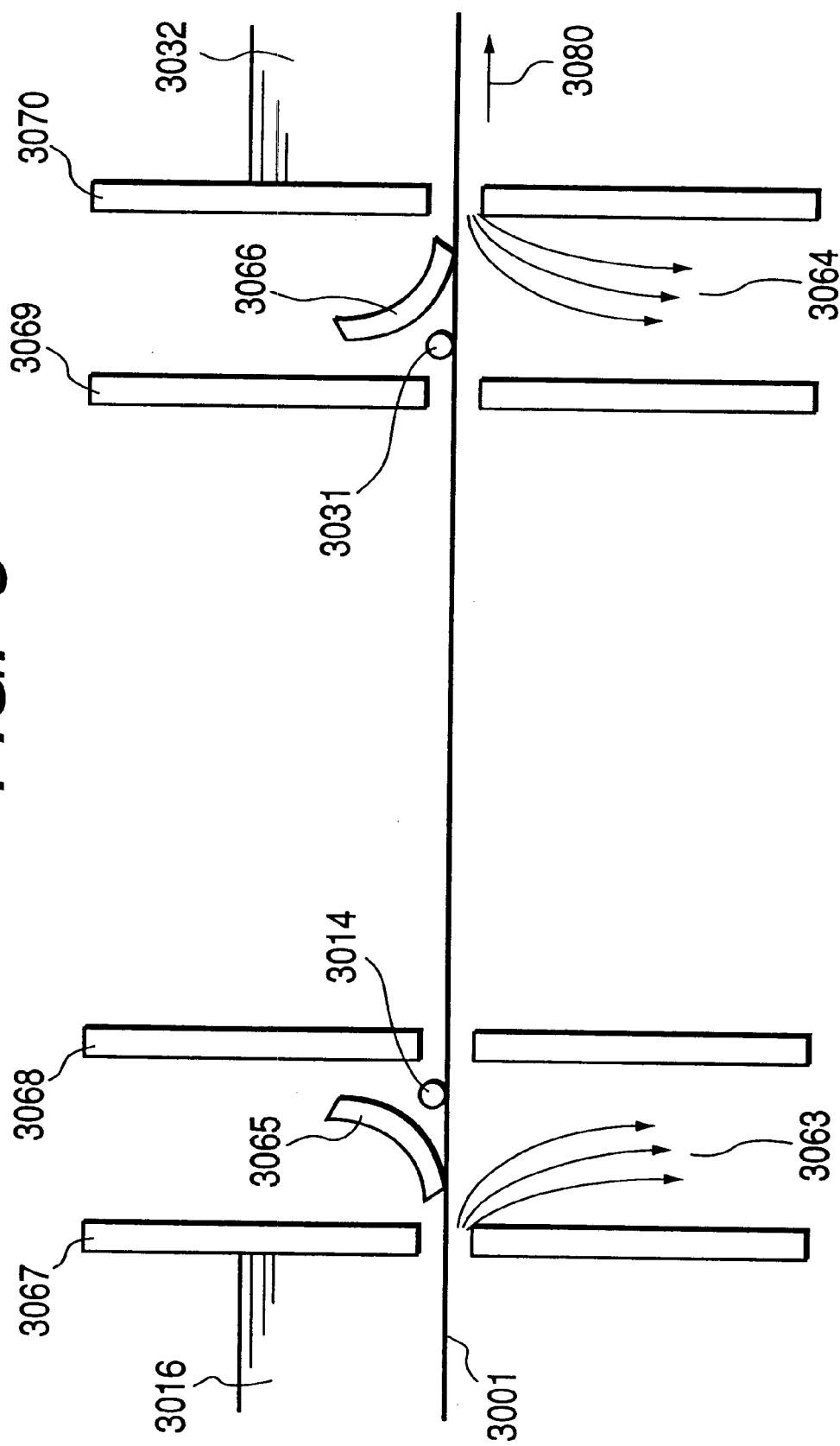
FIG. 3 is a schematic magnified view of the vicinity of the connecting part of the electrodeposition vessel and the rinsing vessel in the electrodeposition apparatus of the present invention.

FIG. 3 is a schematic magnified view of the vicinity of connecting portion between the electrodeposition vessel and the rinsing vessel. In FIG. 3, the electrodeposition bath 3016 is supported by an electrodeposition vessel wall 3067, an opening part is provided in a part of the wall, and the substrate 3001 is transported out of the electrodeposition vessel 2009 through the opening part. A part of the bath naturally flows out through the opening part as overflow 3063, which is recovered and returned to the circulating vessel 2025.

As the upper surface (non-film-forming surface) of the substrate 3001 may be subjected to friction of a certain level, the liquid on the upper surface is eliminated by a liquid removing blade 3065 and the position of the substrate 3001 is defined by a supporting roller 3014 so as to match the position of the blade.

An overflow cover 3068 is provided in order to prevent splashing of the overflowing liquid.

The entrance to the rinsing vessel system 2030 is constructed symmetrically to the exit of the electrodeposition vessel 2009 and functions in symmetrical manner. More specifically, the rinsing vessel system 2030 constructed symmetrically to the electrodeposition vessel 2009 is provided with a rinsing vessel wall 3070, an overflow cover 3069, a liquid removing blade 3066 and a supporting roller 3031, and the rinsing vessel supports water 3032 therein.

There are overflows 3063 and 3064 of considerable amounts from the electrodeposition vessel 2009 and the rinsing vessel system 2030, but the surface level of the electrodeposition bath or water can be easily maintained at a position higher by several centimeters than that of the substrate 3001, when the bath circulating pump 2023 and the water circulating pumps 2044 to 2046 have a sufficiently large circulating capacity in the order of 100 to 200 liter/min.

In the apparatus employed in the experiment, the distance between the electrodeposition vessel wall 3067 and the overflow cover 3068 was 150 mm, that between the overflow covers 3068 and 3069 was 200 mm and that between the overflow cover 3069 and the rinsing vessel wall 3070 was 150 mm.

The electrodeposition bath 3016 was maintained at 80° C. while the water 3032 was maintained at 25° C., and the transporting rate of the substrate 3001 was set to 2000 mm/min. The electrodeposition bath 3016 contained zinc nitrate and a zinc anode was employed to execute electrodeposition of zinc oxide.

The substrate 3001 was composed of stainless steel (SUS430), and the thickness of a zinc oxide film formed in the entire electrodeposition vessel was about 1 $\mu$m.

It was confirmed, at the position of the substrate wind-up roller, that the surface of the zinc oxide film showed an extremely large amount of unevenness. The unevenness was only very vaguely identified on the zinc oxide film itself. However, extremely clear unevenness was observable after the CVD deposition of amorphous silicon with a thickness of about 1 $\mu$m on the zinc oxide film, and the short circuit current density characteristics (Jsc) of the solar cell utilizing such films also showed fluctuations corresponding to such unevenness.

Under close observation, the unevenness of undulating stripe pattern is composed of opaque white stripes which are principally curved opposite to the substrate transporting direction with a radius of curvature from several millimeters to several centimeters and with a width ranging from about a half millimeters to several millimeters, and which show a clear boundary at the transporting direction side but show a gradually diminishing boundary at the opposite side.

By interrupting the substrate transportation in the course of film formation, it was determined that the unevenness of the undulating stripe pattern was mostly formed on the substrate transported from the overflow cover 3068 to of the overflow 3064, in particular, immediately after the overflow cover 3069. On such substrate, there are no electrochemical reactions such as electrodeposition.

It was also observed that the point at which the unevenness formed shifted upstream of the transporting direction, when increasing the overflow 3064. Also the unevenness was not observed at all when the film forming surface of the substrate after film formation covered with the electrodeposition bath solution transferred from the electrodeposition bath 3016 was rinsed with pure water in another rinsing tank.

Also, when the bath solution was applied dropwise on the film forming surface after formation of an uniform zinc oxide film and then the surface was rinsed with pure water in another rinsing vessel after the dropped solution was dried to a certain extent, a clear arc-shaped white trace of the dropped solution was formed.

On the other hand, when pure water was applied dropwise and dried on the film forming surface after formation of an uniform zinc oxide film, there was no trace of the liquid.

The unevenness of the undulating stripe pattern once formed on the film forming surface of the long substrate or the trace formed by the dropped solution cannot be removed by rinsing with pure water in another rinsing vessel.

The bath solution transferred onto the film forming surface of the long substrate dried faster in comparison with the bath solution transferred onto a stainless steel substrate on which a zinc oxide film is not formed, and such tendency is more conspicuous when the substrate temperature is elevated by immersion in the bath with a high temperature.

Furthermore, the unevenness of the undulating stripe pattern was not formed without any change in the substrate transporting speed, when the zinc nitrate concentration of the bath was 0.01 mol/liter.

Based on these experimental results, it was concluded that the unevenness of the undulating stripe pattern was formed by depositing zinc nitrate constituting the solute of the electrodeposition bath on the film forming surface of the substrate, in the course of drying of the solution transferred onto the substrate, with an undulating boundary by natural drying or with a clear boundary after the solution was drawn by the overflow of pure water.

Therefore, when pure water was sprayed as mist from a mist blower on both surfaces of the substrate, the unevenness of a zinc oxide film was not observed at the substrate wind-up roller 2062, and the solar cell produced by forming amorphous silicon by CVD deposition showed uniform characteristics without unevenness.

Also, a similar result was obtained by replacing pure water with water 3032 of the first rinsing vessel 2032, which contained a certain amount of the transferred bath solution. This result indicates that the water of the first rinsing vessel 2032 can be utilized again before being disposed.

Then, when mist was sprayed only on the film forming surface, the film forming surface of the substrate after drying did not show any unevenness but the non-film-forming surface showed white traces of scraping with the liquid removing blade. A solar cell produced similarly with such substrate did not show unevenness in the characteristics. When measured, however, the white powder deposited on the back surface (non-film-forming surface) was removed.

Then, the electrodeposition bath was maintained at room temperature and an indium oxide film was formed on the substrate by employing indium nitrate as the main component of the bath. The unevenness by drying was not formed between the electrodeposition vessel and the rinsing vessel at the predetermined substrate transporting speed, even without mist spraying.

Film formation was executed by using the solution containing indium nitrate as the main component and maintaining the solution at 50° C., and the obtained film showed formation of unevenness by drying, between the electrodeposition vessel and the rinsing vessel. Such unevenness drastically decreased when the space between the overflow covers 3068 and 3069 was covered with an aluminum foil to maintain the humidity of such space at 95% or higher.

A satisfactory effect of preventing the unevenness was also obtained when the liquid mist spraying (water scattering) by the mist blower was replaced with the liquid mist spraying by a humidifier or an ultrasonic vibrator.

Also, the formation of the evenness of the undulating stripe pattern was almost eliminated when the transporting speed of the long substrate was tripled, without the water mist scattering.

When pure water was scattered on the film forming surface by utilizing a hose having a closed end and provided with fine holes, in the vicinity of the exit of the overflow cover 3068 in combination with the increase of the transporting speed, the unevenness of the undulating stripe pattern on zinc oxide was not observed at the substrate wind-up roller 2062, and the solar cell produced by depositing amorphous silicon by CVD showed uniform characteristics without unevenness.

However, when the drying proceeds fast because of a low amount of water scattering, the unevenness of the undulating stripe pattern contains many arcs in the opposite direction, so that the effect of water scattering is rather adverse.

Also, a similar result was obtained by replacing pure water with water 3032 of the first rinsing vessel 2032, which contained a certain amount of the transferred bath solution. This result indicates that the water of the first rinsing vessel 2032 can be utilized again before being disposed.

In the following a preferred embodiment of the electrodeposition apparatus of the present invention will be explained, but it is to be understood that the present invention is not limited to such embodiment.

Figure 2:
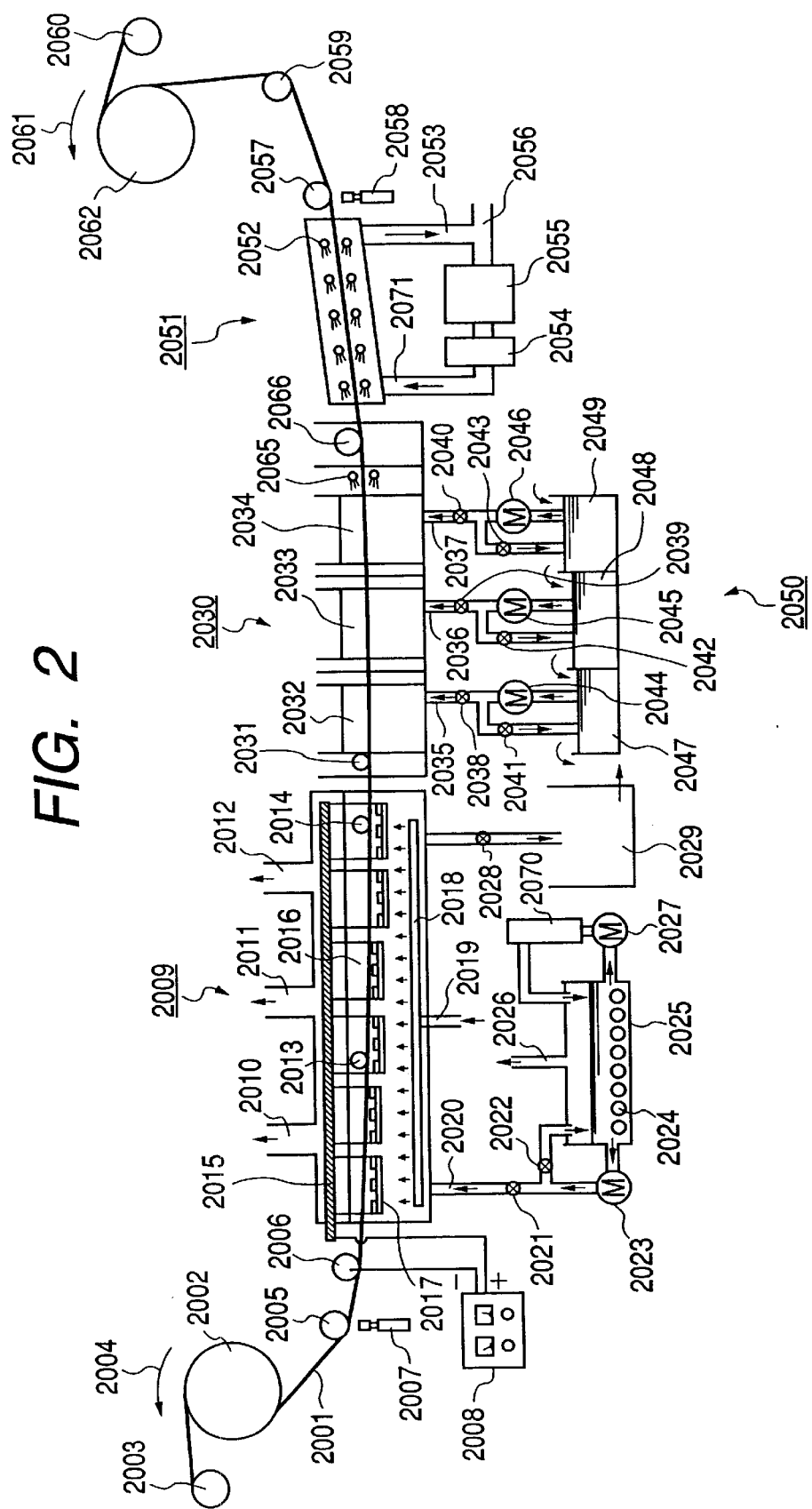
FIG. 2 is a schematic view showing one example of the apparatus in which the present invention is applicable.

The main components of the electrodeposition apparatus of the present embodiment are basically similar to those of the electrodeposition apparatus shown in FIG. 2, but various improvements are incorporated in order to solve the drawbacks of the apparatus. For the purpose of convenience, these components will be explained with the same numbers as those in FIG. 2.

The electrodeposition apparatus of the present embodiment for continuously forming a uniform oxide on a long substrate 2001 is provided with an electrodeposition vessel 2009 for forming an oxide on the substrate 2001 by supplying a current between the long substrate 2001 and an anode 2017 in an electrodeposition bath 2016, a rinsing means such as a rinsing vessel system 2030 for rinsing the substrate 2001 after passing the electrodeposition vessel 2009, and a drying means such as a hot air drying oven 2051 for forced drying of the substrate 2001 after passing the rinsing vessel system 2030, wherein the transporting speed of the transport means is optimized and liquid scattering means is provided. These components will be explained in detail in the following.

Substrate

The substrate 2001 employed in the present invention can be composed of any material that provides electric conductivity on the film forming surface and is not corroded by the electrodeposition bath 2016, for example, a metal such as stainless steel (SUS), aluminum, copper or iron or an alloy thereof. There may also be employed a PET film having a metal coating thereon.

Among these materials, stainless steel is advantageous for forming elements, and an elongated or long substrate is advantageous for enabling continuous film formation.

The surface of the substrate may be smooth or coarse. When the surface is coarse with irregularities exceeding submicron order, the unevenness by drying tends to be formed between the electrodeposition vessel 2009 and the rinsing vessel system 2030 even if a film with satisfactory wettability is formed, but the present invention is effective for preventing the unevenness.

Also the substrate 2001 may be provided with a film of another conductive material, which can be selected according to the purpose of the electrodeposition.

Electrodeposition Vessel

The electrodeposition vessel employed in the present invention may be composed of a metal, such as stainless steel (SUS), iron, aluminum, copper, chromium or brass because of excellent heat resistance and workability, and stainless steel is preferred because of its anticorrosive property. Various stainless steels such as ferrites, maltensites and austenites can be employed.

If temperature maintaining property is required for the electrodeposition vessel, the vessel employs a double-wall structure, and the space between the walls may be filled with a heat insulating material such as air, oil, glass wool or urethane resin in consideration of the temperature and the ease of handling.

Electrodeposition Bath

The electrodeposition bath 2016 in the electrodeposition vessel 2009 may be mainly composed of zinc nitrate for forming a zinc oxide film, as well as the well known baths for metal plating. For improving the uniformity of a film, a saccharide such as sucrose or dextrin is preferably added to the bath.

For forming a zinc oxide film with surface irregularities on the order of wavelength of the light, effective as the optical confinement-reflective layer of the solar cell, the concentration of zinc nitrate is preferably maintained at 0.1 mol/liter or more. Also for obtaining a zinc oxide film with the c-axis orientation, the concentration is preferably maintained at 0.05 mol/liter or less in general, though it is also dependent on the substrate to be employed.

In either case, the concentration of the saccharide added to the bath is preferably 3 g/liter or more in case of sucrose, or 0.01 g/liter or more in case of dextrin. The bath is preferably maintained at 60° C. or higher in order to avoid metal precipitation. In particular, a temperature of 80° C. or higher is preferred in order to improve the uniformity of the obtained film. Therefore, the effect of the present invention be enhanced in these temperature ranges.

In case of depositing indium oxide, it is preferable to maintain the concentration of indium nitrate at 0.0001 mol/liter or more and to add saccharide in a similar concentration. However, the bath temperature is preferably maintained below 60° C.

When depositing such oxide with surface irregularities, spontaneous drying tends to occur between the electrodeposition vessel 2009 and the rinsing vessel system 2030 together with formation of unevenness, but in this case the present invention is particularly effective for preventing the unevenness.

Several electrodeposition vessels are employed when multiple baths are required or in case the amount of film formed in one bath is insufficient. In the latter case, same electrodeposition vessels may be arranged in succession. In these cases, the same concept can be applied as that at the entry into the rinsing vessel system 2030, and the present invention can be applied by maintaining the substrate transporting speed at a level not causing drying of the substrate or by scattering water or the bath solution itself in order prevent drying.

Rinsing Means

The rinsing means in the present invention can be a system of passing the substrate 2001 through water in the rinsing vessel system 2030 as shown in FIG. 2 or a rinsing shower. However, even in the latter case, the unevenness once formed in drying cannot be effectively eliminated only by rinsing.

Also, when the electrodeposition bath 2016 contains sucrose or the like a solubility of which increases with the rise in temperature, a higher temperature of the rinsing water is preferred in order to increase the rinsing effect, and the humidifying means of the present invention may be employed between the rinsing vessels if necessary.

Drying Means

As the drying means employed in the present invention, water removal with an air knife as shown in FIG. 2 is extremely effective after sufficient elimination of the water-soluble solute, and subsequent heat-drying can be sufficiently achieved with hot air. When a vacuum apparatus is employed in the following step, an infrared heater may also be employed for eliminating the absorbed water.

Transporting Means

In the substrate transporting means employed in the present invention, there is preferably applied a tension of at least 0.5 kg per 1 cm of the width of the substrate in order to prevent vertical vibration of the substrate which causes formation of stepwise unevenness between the vessels.

In particular, the vertical movement in the overflowing portion tends to generate the unevenness caused by liquid overflowing or splashing. Therefore, the transporting path is preferably secured by the supporting magnet rollers (in case of a ferromagnetic substrate).

In the present invention, the transporting speed of the transporting means is preferably selected so that the substrate passes the space between the vessels within a time shorter than the time required for spontaneously drying the solution transferred from the electrodeposition bath 2016 to the substrate surface to deposit the solute in the space between the vessels. When the long substrate 2001 is transported with such transporting speed, the solution transferred from the electrodeposition vessel 2016 to the substrate surface is transported to the rinsing vessel system 2030 before it is spontaneously dried, whereby the solute such as zinc nitrate does not precipitate and the unevenness of the undulating stripe pattern is not formed.

FIGS. 2 and 3 illustrate a configuration in which the substrate is transported in the horizontal direction with liquid overflowing, but the present invention is likewise applicable to a configuration in which the substrate is transported in an inclined state, with bent rollers positioned between the vessels.

Liquid Scattering (Humidifying) Means

The liquid scattering (humidifying) means to be employed in the present invention can be a nozzle, a shower or the like, as well as the hose with the closed end and with fine holes as utilized in the investigation experiments. The scattered liquid may be sprayed as mist, but is preferably applied in continuously in the form of liquid droplets to the film forming surface of the substrate, in order to generate a sufficient liquid flow to effectively dilute or discharge the solute in the transferred solution.

The liquid to be scattered can be water, a solution being the same as the preceding electrodeposition bath, or a mixture thereof with water.

Also, the liquid scattering (humidifying) means to be employed in the present invention can be mist spraying, liquid spraying by an ultrasonic vibrator or liquid spraying by a piezoelectric element. Heated steam can also be applied for a film for which heating is adequate. Here, it is necessary to pay attention to the ambient temperature in order to prevent drying.

Also, for a film sensitive to the temperature, it is effective to cover the space between the vessels with a cover member capable of reducing the ambient temperature such as a water jacket to prevent drying. For enhancing such an effect, a cooling medium from a chiller may be circulated in the jacket instead of water.

Examples of the present invention will be described below, and the present invention is not limited to them.

EXAMPLE 1

Figure 1:
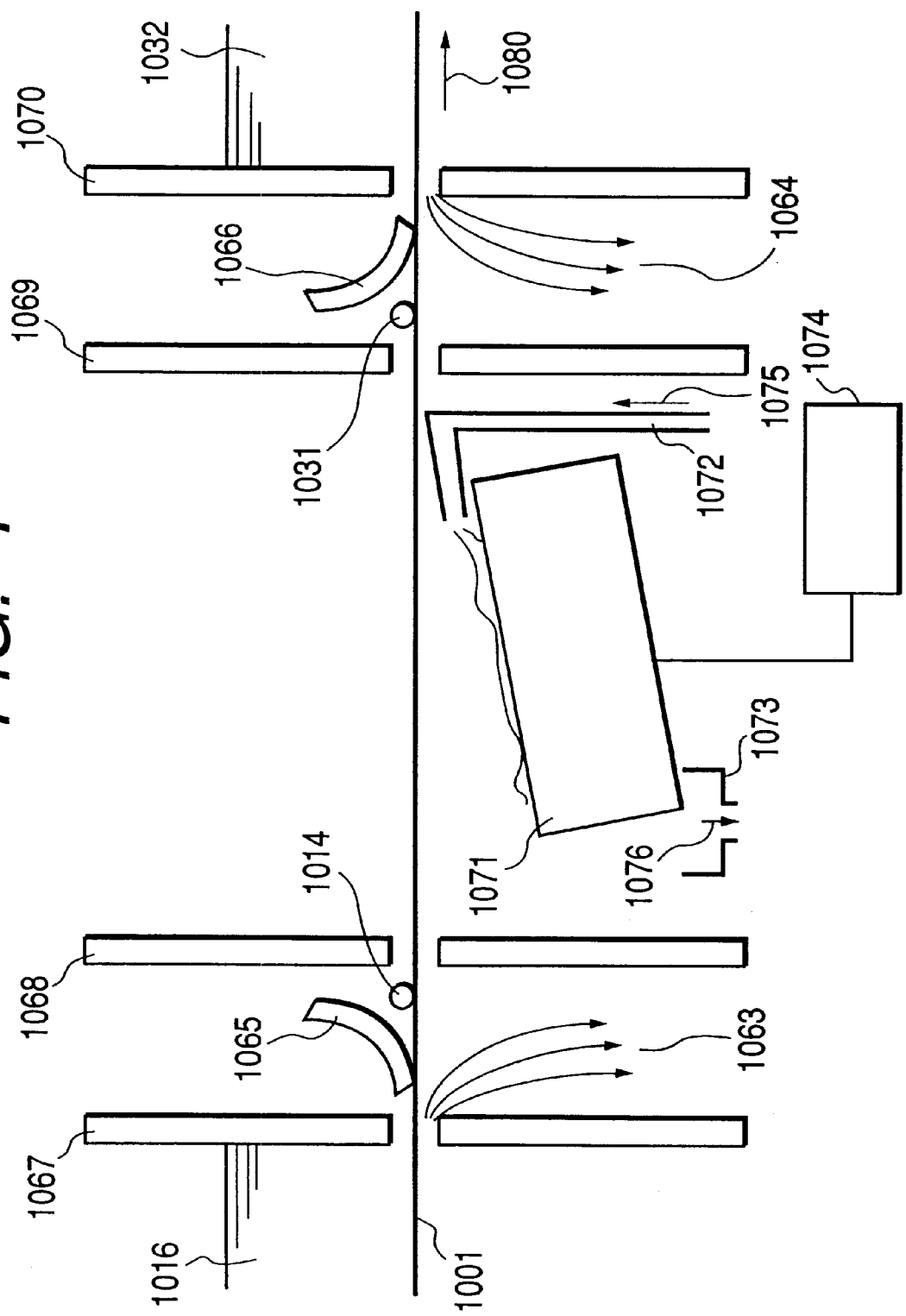
FIG. 1 is a partial magnified view of one example of the electrodeposition apparatus of the present invention.

FIG. 1 is a partial magnified view of one example of the electrodeposition apparatus of the present invention. In FIG. 1, the numeral 1001 indicates a substrate, 1014 and 1031 supporting rollers, 1016 an electrodeposition bath, 1032 water, 1063 and 1064 overflows, 1065 and 1066 liquid removing blades, 1071 an ultrasonic vibrator, 1072 a pure water supply pipe, 1073 an unused water recovery pan, 1074 an ultrasonic power source, 1067 an electrodeposition vessel wall, 1068 and 1069 overflow covers, and 1070 a rinsing vessel wall.

In the present example, a 40 kHz ultrasonic vibrator 1071 of a power of 200 W covered with stainless steel was inclined between the electrodeposition vessel 2009 and the rinsing vessel system 2030 and connected to the ultrasonic power source 1074 to generate ultrasonic waves synchronous with the transportation of the substrate 1001.

On the surface of the ultrasonic vibrator 1071 opposed to the substrate 1001, pure water flowed at a rate of 100 ml/min from the pure water supply pipe 1072 constituting the liquid supply means to generate small water droplets, thereby maintaining the atmosphere in the vicinity of the film forming surface of the substrate 1001 in a superhumidified state.

Pure water which did not form misty water droplet was recovered by gravity in the unused water recovery pan 1073 constituting the unused liquid recovery means, and was dropped again onto the ultrasonic vibrator 1071 from the pure water supply pipe 1072 by the circulating means not shown in the drawings.

The employed substrate 1001 was composed of a 2D-treated stainless steel substrate (SUS430) having a thickness of 0.12 mm, with underlying thin aluminum layers each having a thickness of 2000 Å and a smooth zinc oxide layer having a thickness of 2000 Å, both formed by sputtering.

The aluminum film was formed in order to secure reflectivity in the photovoltaic element.

The smooth zinc oxide film was formed in order to improve adhesion and to control the particle size in the electrodeposition step, namely the size of surface irregularities on the order of wavelength of the light. The irregularities on the order of wavelength of the light were formed in order to effectively utilize the reflected light when the electrodeposited film of the present invention was employed as the reflection layer of the solar cell, thereby achieving excellent short circuit current (Jsc) characteristics of the solar cell.

The supporting rollers 1014 and 1031 in FIG. 1 were composed of magnet rollers with a surface magnetic flux density of 1100 Gauss, in order to pull up the substrate and to transport the substrate to a predetermined position. The stainless steel substrate 1001 employed in the present example was composed of ferrite based SUS430, and was therefore magnetic.

The transporting speed of the substrate was set to 500 mm/min, and the supporting rollers 1014 and 1031 were rotated corresponding to the advancing substrate, thereby preventing formation of scars on the non-electrodeposited surface of the substrate.

The tension during transportation was 2.5 kgs per 1 cm of the width of the substrate. The substrate during transportation was almost free from vibration or lateral displacement, and the substrate surface was supported in a substantially flat state.

The rinsing water 1032 was composed of deionized water, and flowed from the third rinsing circulating vessel 2049 toward the first rinsing circulating vessel 2047, as shown in FIG. 2. The zinc ion concentration in the first rinsing circulating vessel 2047, resulting from the bath solution transferred from the electrodeposition bath was 66 ppm. The sufficient rinsing effect was obtained.

The drying was controlled so that the ambient temperature of the hot air drying oven 2051 was 80° C. A hot air generating oven 2055 of 7 kW was employed and the air had a temperature of 150° C. immediately after emerging from the air blow pipe 2052.

The electrodeposition bath 2016 consisted of a solution containing 0.2 mol/liter of zinc nitrate and 0.7 g/liter of dextrin, and was left standing overnight after dissolving. The bath was maintained at a temperature of 85° C. and agitated with air at a flow rate of 20 m$^3$/hr.

The anode 2017 was composed of a 4-N zinc plate and an electrodeposition current of a density of 2 mA/cm$^2$ was supplied between the anode 2017 and the substrate 1001 to deposit zinc oxide with a thickness of 1.2 $\mu$m. Zinc oxide was composed of a cluster of polycrystals, and the observation with a scanning electron microscope (SEM) confirmed that the polycrystals had a size on the order of 1 $\mu$m.

The above-described film was employed as the reflective layer, and a so-called triple cell structure was formed, as the photovoltaic layers of the solar cell, consisting of a combination of three pin junctions, each composed of a-SiGe ("a-" means amorphous) and a-Si. On a thus formed semiconductor layers, there was sputtered an ITO layer having a thickness of 700 Å as the upper electrode.

The resulting solar cell was subjected to the I-V measurement under light of a solar simulator.

The I-V characteristics obtained when the ultrasonic vibrator 1071 was turned off showed fluctuation according to the unevenness of the uldulating stripe pattern. In particular, the serial resistance showed a significant fluctuation in a range of 90 to 200 $\Omega$/cm$^2$, in comparison with the usual value of 24 $\Omega$/cm$^2$. Consequently the characteristics showed defects such as those in the I-V curve. Also the short circuit current density Jsc was as low as 6.4 mA/cm$^2$ or lower.

On the other hand, when the ultrasonic vibrator 1071 was turned on, the unevenness could not be visually observed, and the I-V curve was of a satisfactory shape with the serial resistance in a range of 23 to 28 $\Omega$/cm$^2$. The short circuit current density Jsc was also in a satisfactory range of 7.0 to 7.3 mA/cm$^2$. Thus the present invention is extremely effective.

EXAMPLE 2

Example 2 was conducted in the same manner as Example 1, except that the ultrasonic vibrator 1071 was replaced by a humidifier (used for indoor humidifying in winter for preventing drying of a room) utilizing a piezoelectric element as the humidifying means. The mist from the humidifier was applied to the both surfaces of the substrate 1001 in the space between the electrodeposition vessel 2009 and the rinsing vessel system 2030.

The present example not only drastically reduced the unevenness on the film forming surface as in Example 1 but also resulted in no powder deposition pattern on the non-film-forming surface, thereby minimizing the influence on the following step.

EXAMPLE 3

Example 3 was conducted in the same manner as Example 1 except that the ultrasonic vibrator 1071 was replaced by a vapor generator using a heating range and a pan as the humidifying means. Also a steam cover was provided between the electrodeposition vessel 2009 and the rinsing vessel system 2030. The mist from the vapor generator was sprayed onto the both surfaces of the substrate 1001, in the space covered with the steam cover, between the electrodeposition vessel 2009 and the rinsing vessel system 2030. In this state, the humidity in the vicinity of the substrate surface was about 90%.

The present example could drastically reduce the unevenness on both surface of the substrate, similar to Example 2, even when the electrodeposition bath contained a solute that tends to precipitate with a decrease in the temperature, such as sucrose, because the high substrate temperature could be maintained by the heat transferred from vapor to the substrate 1001.

EXAMPLE 4

In the electrodeposition apparatus shown in FIG. 2, a shower nozzle was provided between the electrodeposition vessel 2009 and the rinsing vessel system 2030, and pure water was scattered at a range of 300 ml/min. The pure water after contacting the substrate surface was discarded immediately as it had a high concentration of the solute of the solution.

The employed substrate 2001 consisted of a 2D-treated stainless steel plate (SUS430) having a thickness of 0.12 mm, with underlying thin aluminum layers each having a thickness of 1000 Å and a smooth zinc oxide layer having a thickness of 2000 Å, both formed by sputtering.

The aluminum layer was formed to secure reflectivity in the photovoltaic element.

The smooth zinc oxide film was formed in order to improve adhesion and to control the particle size in the electrodeposition step, namely the size of surface irregularities on the order of wavelength of the light. The irregularities on the order of wavelength of the light were formed in order to effectively utilize the reflected light when the electrodeposited film of the present invention was employed as the reflection layer of the solar cell, thereby achieving excellent short circuit current density (Jsc) characteristics in the solar cell.

The supporting rollers 3014 and 3031 in FIG. 3 were composed of magnet rollers with a surface magnetic flux density of 1100 Gauss, in order to pull up the substrate and transport the substrate to a predetermined position. The stainless steel substrate 2001 employed in the present example was composed of ferrite based SUS430, and was therefore magnetic.

The transporting speed of the substrate was set to 500 mm/min, and the supporting rollers 3014 and 3031 were rotated depending on the advancing substrate, thereby preventing formation of scars on the non-electrodeposited surface of the substrate.

The tension during transportation was 2.5 kgs per 1 cm of the width of the substrate. The substrate during transportation was almost free from vibration or lateral displacement, and the substrate surface was supported in a substantially flat state.

The rinsing water was composed of deionized water, and flowed from the third rinsing circulating vessel 2049 toward the first rinsing circulating vessel 2047, as shown in FIG. 2. The zinc ion concentration in the first rinsing circulating vessel 2047, resulting from the both solution transferred from the electrodeposition bath was 66 ppm. The sufficient rinsing effect was obtained.

The drying was controlled so that the ambient temperature of the hot air drying oven 2051 became 80° C. A hot air generating oven 2055 of 7 kW was employed and the air had a temperature of 150° C. immediately after emerging from the air blow pipe 2052.

The electrodeposition bath 2016 consisted of a solution containing 0.2 mol/liter of zinc nitrate and 0.7 g/liter of dextrin, and was left standing overnight after dissolving. The bath was maintained at a temperature of 85° C. and agitated with air at a flow rate of 20 m$^3$/hr.

The anode 2017 was composed of a 4-N zinc plate and an electrodeposition current of a density of 2 mA/cm$^2$ was supplied between the anode 2017 and the substrate 1001 to deposit zinc oxide with a thickness of 1.2 μm. The zinc oxide was composed of a cluster of polycrystals, and the observation with SEM confirmed that the polycrystals had a size on the order of 1 μm.

The above-described film was employed as the reflective layer, and the triple cell structure was formed, as the photovoltaic layers of the solar cell, consisting of a combination of three pin junctions, each composed of a-SiGe and a-Si, by using a CVD film forming apparatus for a long substrate. On thus formed semiconductor layers, there was sputtered an ITO layer having a thickness of 700 Å as the upper electrode.

The solar cell thus produced was subjected to the I-V measurement under light of a solar simulator.

The I-V characteristics obtained when the liquid droplet shower was turned off showed fluctuation according to the unevenness of the uldulating stripe pattern. Particularly in the white boundary portion, the serial resistance showed a significant fluctuation in a range of 90 to 200 Ω/cm$^2$, in comparison with the usual value of 24 Ω/cm$^2$. Consequently the characteristics showed defects such as those in the I-V curve. Also the short circuit current density Jsc was as low as 6.6 mA/cm$^2$ or less.

On the other hand, when the liquid droplet shower was turned on, the unevenness could not be observed under visual observation, and the I-V curve was of a satisfactory shape with the serial resistance in a range of 23 to 28 Ω/cm$^2$. The short circuit current density Jsc was also in a satisfactory range of 7.0 to 7.3 mA/cm$^2$. Thus the present invention was extremely effective.

EXAMPLE 5

An additional electrodeposition vessel was added to the electrodeposition apparatus shown in FIG. 2. The additional electrodeposition vessel was added between the electrodeposition vessel 2009 and the rinsing vessel system 2030 shown in FIG. 2, and constructed with the same horizontal transporting method. The electrodeposition bath employed in the additional electrodeposition vessel had the same concentration and temperature as that in the original electrodeposition vessel 2009.

Between the additional electrodeposition vessel and the rinsing vessel system 2030, there was provided the same liquid scattering means for pure water as that used in Example 4, and, between the additional electrodeposition vessel and the original electrodeposition vessel 2009 there was also provided the same liquid scattering means except for scattering the bath solution employed in the original electrodeposition bath in place of pure water.

In Example 5, similarly to Example 4, there was no unevenness of the undulating stripe pattern. The present example could not only drastically reduce the unevenness of the undulating stripe pattern but also achieve electrodeposition of a sufficiently thick zinc oxide film because of the additional electrodeposition vessel.

EXAMPLE 6

In this example, an additional electrodeposition vessel was provided similarly to Example 5, and between the original electrodeposition tank 2009 and the additional electrodeposition tank, the long substrate 2001 was transported by a roller contacting the substrate surface.

The roller was composed of a stainless steel structural member and PFA wound thereon, and the bath solution was scattered by a shower nozzle onto the roller and the film forming surface of the substrate.

Similarly to Examples 4 and 5, Example 6 did not show formation of the unevenness of the undulating stripe pattern. As the substrate transporting direction is not necessarily limited to the horizontal direction in the present example, the freedom of designing of the entire electrodeposition apparatus is significantly increased, whereby an excellent reflective layer adapted for use in the solar cell can be provided in an extremely inexpensive and stable manner.

EXAMPLE 7

A solar cell was produced by electrodepositing zinc oxide in the same manner as in Example 4, except that the liquid droplet shower was not activated and the substrate transporting speed was set to 2000 mm/min.

In this example, the unevenness could not be visually observed, presumably because the substrate surface was not dried between the vessels, due to the increased substrate transporting speed. The I-V curve was of a satisfactory shape with the serial resistance in a range of 23 to 28 Ω/cm$^2$. The short circuit current density Jsc was also in a satisfactory range of 6.9 to 7.3 mA/cm$^2$.

According to the present invention, as explained in the foregoing, the bath solution transferred from the electrodeposition vessel onto the substrate surface is transported to the rinsing vessel before spontaneous drying takes place, whereby the precipitation of the solute can be prevented, an oxide film can be uniformly electrodeposited on the long substrate without formation of the vague undulating stripe pattern and the formed oxide film can be advantageously employed, for example, as the reflective layer of the solar cell.

Also the electrodeposition can be executed with stability in an electrodeposition process requiring a high temperature, such as that for zinc oxide, by maintaining the electrodeposition bath at a temperature of 60° C. or higher, preferably 80° C. or higher.

Also the electrodeposition of zinc oxide with a sufficiently large thickness can be easily achieved even with an elevated transporting speed of the substrate, by employing plural electrodeposition vessels.

Also since there is provided the liquid scattering means for preventing drying of the bath solution transferred onto the substrate surface from the electrodeposition bath, the solute in the bath solution transferred from the electrodeposition vessel can be effectively diluted or discharged.

Furthermore, the substrate transporting direction is not necessarily limited to being horizontal by the use of a roller, such as a magnet roller, in contact with the substrate surface (preferably, an upper surface thereof) as the transport means, whereby significantly broadening the freedom of designing of the entire electrodeposition apparatus.

Also, by selecting zinc oxide as the oxide formed by electrodeposition, water as the medium of solution and zinc nitrate as the solute to be precipitated by drying, there can be formed a uniform zinc oxide film with surface irregularities, which can be used as the reflective layer with a sufficient optical confinement effect, whereby the photovoltaic element with excellent characteristics can be obtained.

Also according to the present invention, since the humidifying means for maintaining at least the film forming surface of the substrate after passing the electrodeposition vessel is provided along the substrate transporting path, at least at the exit side of the electrodeposition vessel, the bath solution transferred onto the substrate surface from the electrodeposition vessel is prevented from drying and the substrate surface is transported in the humidified state to the rinsing vessel. Therefore the precipitation of the solute does not take place and the unevenness on the film forming surface can be prevented.

Also the transporting path between the electrodeposition vessel and the rinsing means can be covered by the enclosing means to maintain the interior thereof in the superhumidified state, thereby preventing drying which results from the elevated substrate temperature. A water jacket can be employed as the enclosing means to reduce the ambient temperature, whereby the present invention becomes applicable even to the oxide sensitive to the temperature.

Furthermore, when plural rinsing vessels are provided as the rinsing means and the rinsing water is maintained at a high temperature promoting the drying of the substrate surface in the transporting path, the humidifying means can be provided between the rinsing vessels to prevent formation of the unevenness on the film forming surface, thereby increasing the rinsing effect due to the high rinsing water temperature even when the electrodeposition bath contain a saccharide such as sucrose.

What is claimed is:

1. A method of forming a deposited film comprising the steps of:
    supplying a current between a substrate and an electrode in an electrodeposition bath of at least one electrodeposition vessel to form an oxide film on the substrate;
    rinsing the substrate after passing the electrodeposition vessel with water by a rinsing means; and
    humidifying at least a film forming surface of the substrate with a humidifying means along a transporting path of the substrate at least at an exit side of the electrodeposition vessels; and
    forming a semiconductor layer by CVD on the oxide film.

2. A method of forming a deposited film according to claim 1, further comprising the step of drying the substrate after passing the rinsing means with a drying means.

3. A method of forming a deposited film according to claim 1, wherein the humidifying is executed to maintain a humidity of at least 95% at a film forming surface of the substrate.

4. A method of forming a deposited film according to claim 1, wherein an elongated substrate is used as the substrate.

5. A method of forming a deposited film according to claim 1, wherein the transporting path between the electrodeposition vessel and the rinsing means is covered with an enclosing means.

6. A method of forming a deposited film according to claim 5, wherein a water jacket is used as the enclosing means.

7. A method of forming a deposited film according to claim 1, wherein the electrodeposition bath contains a saccharide.

8. A method of forming a deposited film according to claim 1, wherein a temperature of the electrodeposition bath is controlled at 60° C. or higher.

9. A method of forming a deposited film according to claim 1, wherein a temperature of the electrodeposition bath is controlled at 80° C. or higher.

10. A method of forming a deposited film according to claim 1, wherein plural electrodeposition vessels are provided as the electrodeposition vessel along the transporting path of the substrate and electrodeposition is executed in the plural electrodeposition vessels.

11. A method of forming a deposited film according to claim 1, wherein plural rinsing vessels are used as the rinsing means.

12. A method of forming a deposited film according to claim 11, wherein a humidifying means is provided between the plural rinsing vessels and humidifies at least the film forming surface of the substrate.

13. A method of forming a deposited film according to claim 1, wherein the humidifying is executed by scattering liquid.

14. A method of forming a deposited film according to claim 13, wherein the liquid scattering is executed by scattering water, a solution being the same as the electrodeposition bath or a mixture thereof.

15. A method of forming a deposited film according to claim 1, wherein the humidifying is executed by spraying liquid mist.

16. A method of forming a deposited film according to claim 1, wherein the humidifying is executed by generating small liquid droplets by utilizing vibration of an ultrasonic vibrator.

17. A method of forming a deposited film according to claim 16, wherein a vibration surface of the ultrasonic vibrator is inclined with respect to the film forming surface of the substrate, and the humidifying means comprises an ultrasonic power source for generating an ultrasonic wave in synchronization with transportation of the substrate, a liquid supply means for supplying a humidifying liquid onto the vibration surface, an unused liquid recovery means for recovering the humidifying liquid not formed into liquid droplets, and a circulation means for circulating the humidifying liquid from the recovery means to the liquid supply means.

18. A method of forming a deposited film according to claim 1, wherein a humidifier utilizing a piezoelectric element is used as the humidifying means.

19. A method of forming a deposited film according to claim 1, wherein a water vapor generator is used as the humidifying means.

20. A method of forming a deposited film according to claim 1, wherein a magnet roller in contact with a film non-film-forming surface of the substrate is used as means for transporting the substrate.

21. A method of forming a deposited film according to claim 1, wherein an aqueous solution of zinc nitrate is used as the electrodeposition bath.

22. A method of forming a deposited film comprising the steps of:
   supplying a current between a substrate and an electrode in an electrodeposition bath of at least one electrodeposition vessel to form an oxide film on the substrate;
   rinsing the substrate after passing the electrodeposition vessel with water by a rinsing means;
   transporting the substrate after passing the electrodeposition vessel to another electrodeposition vessel or a rinsing means before a substrate surface is dried spontaneously to cause precipitation of a solute of the bath; and
   forming a semiconductor layer by CVD on the oxide film.

23. A method of forming a deposited film according to claim 22, further comprising the step of humidifying at least a film forming surface of the substrate in the transporting path of the substrate at least at an exit side of the electrodeposition vessel.

24. A method of forming a deposited film according to claim 23, wherein the humidifying is executed to maintain a humidity of at least 95% at the film forming surface of the substrate.

25. A method of forming a deposited film according to claim 23, wherein the humidifying is executed by liquid scattering.

26. A method of forming a deposited film according to claim 25, wherein the liquid scattering is executed by scattering water, a solution being the same as the electrodeposition bath or a mixture thereof.

27. A method of forming a deposited film according to claim 23, wherein the humidifying is executed by spraying liquid mist.

28. A method of forming a deposited film according to claim 23, wherein the humidifying is executed by generating small liquid droplets by utilizing vibration of an ultrasonic vibrator.

29. A method of forming a deposited film according to claim 28, wherein a vibration surface of the ultrasonic vibrator is inclined with respect to the film forming surface of the substrate, and the humidifying means comprises an ultrasonic power source for generating an ultrasonic wave in synchronization with transportation of the substrate, a liquid supply means for supplying a humidifying liquid onto the vibration surface, an unused liquid recovery means for recovering the humidifying liquid not formed into liquid droplets, and a circulation means for circulating the humidifying liquid from the recovery means to the liquid supply means.

30. A method of forming a deposited film according to claim 23, wherein a humidifier utilizing a piezoelectric element is used as the humidifying means.

31. A method of forming a deposited film according to claim 23, wherein a water vapor generator is used as the humidifying means.

32. A method of forming a deposited film according to claim 22, further comprising the step of drying the substrate after passing the rinsing means with a drying means.

33. A method of forming a deposited film according to claim 22, wherein an elongated substrate is used as the substrate.

34. A method of forming a deposited film according to claim 22, wherein a transporting path between the electrodeposition vessel and the rinsing means is covered with an enclosing means.

35. A method of forming a deposited film according to claim 34, wherein a water jacket is used as the enclosing means.

36. A method of forming a deposited film according to claim 22, wherein the electrodeposition bath contains a saccharide.

37. A method of forming a deposited film according to claim 22, wherein a temperature of the electrodeposition bath is controlled at 60° C. or higher.

38. A method of forming a deposited film according to claim 22, wherein a temperature of the electrodeposition bath is controlled at 80° C. or higher.

39. A method of forming a deposited film according to claim 22, wherein plural electrodeposition vessels are provided as the electrodeposition vessel along a transporting path of the substrate and electrodeposition is executed in the plural electrodeposition vessels.

40. A method of forming a deposited film according to claim 22, wherein plural rinsing vessels are used as the rinsing means.

41. A method of forming a deposited film according to claim 40, wherein a humidifying means is provided between the plural rinsing vessels and humidifies at least a film forming surface of the substrate.

42. A method of forming a deposited film according to claim 22, wherein a magnet roller in contact with the non-film-forming surface of the substrate is used as means for transporting the substrate.

43. A method of forming a deposited film according to claim 22, wherein an aqueous solution of zinc nitrate is used as the electrodeposition bath.

* * * * *

UNITED STATES PATENT AND TRADEMARK OFFICE
CERTIFICATE OF CORRECTION

PATENT NO.    : 6,471,848 B1
DATED         : October 29, 2002
INVENTOR(S)   : Kozo Arao et al.

It is certified that error appears in the above-identified patent and that said Letters Patent is hereby corrected as shown below:

Title page,
Item [56], FOREIGN PATENT DOCUMENTS,
"09092861" should read -- 9-092861 --.
Item [57], ABSTRACT,
Line 4, "or" should read -- on --.

Column 1,
Line 19, "atternative" should read -- alternative to --;
Line 39, "a" should read -- an --;
Line 45, "an" should read -- and --; and "and" should read -- an --; and
Line 55, "passing" should read -- passing through --.

Column 3,
Line 42, "toward than at" should read -- than --; and
Line 44, "clearer" should read -- becomes clearer --.

Column 4,
Line 32, "of" should read -- compared to --;
Line 33, "polycrystaline" should read -- polycrystalline --;
Line 40, "than these advantages" should read -- advantages than these --; and
Line 50, "in" should read -- of --; and "of" should read -- in --.

Column 5,
Lines 3 and 13, "rising" should read -- rinsing --;
Line 15, "after the" should be deleted; and
Line 29, "Furthermore" should read -- Furthermore, --.

Column 6,
Line 45, "significantly" should read -- whereby significantly --.

Column 8,
Line 3, "half millimeters" should read -- half millimeter --;
Line 9, "to of" should read -- to --;
Line 22, "an" should read -- a --; and
Line 28, "an" should read -- a --.

UNITED STATES PATENT AND TRADEMARK OFFICE
CERTIFICATE OF CORRECTION

PATENT NO. : 6,471,848 B1
DATED : October 29, 2002
INVENTOR(S) : Kozo Arao et al.

It is certified that error appears in the above-identified patent and that said Letters Patent is hereby corrected as shown below:

Column 9,
Line 48, "following" should read -- following, --; and
Line 51, "embodiment." should read -- an embodiment. --.

Column 10,
Line 64, "be" should read -- is --.

Column 11,
Line 18, "prevent" should read -- to prevent --; and
Line 58, "such" should read -- such a --.

Column 12,
Line 8, "in" should be deleted.

Column 13,
Line 59, "layers," should read -- layer, --;
Line 65, "fluctuation" should read -- fluctuations --; and
Line 66, "uldulating" should read -- undulating --.

Column 14,
Line 32, "1" should read -- 1, --; and
Line 43, "surface" should read -- surfaces --.

Column 15,
Line 30, "both" should read -- bath --;
Line 63, "fluctuation" should read -- fluctuations --; and
Line 64, "uldulating" should read -- undulating --.

Column 18,
Line 13, "vessels;" should read -- vessel; --.

UNITED STATES PATENT AND TRADEMARK OFFICE
CERTIFICATE OF CORRECTION

PATENT NO. : 6,471,848 B1
DATED : October 29, 2002
INVENTOR(S) : Kozo Arao et al.

It is certified that error appears in the above-identified patent and that said Letters Patent is hereby corrected as shown below:

Column 19,
Line 20, "film" should be deleted.

Signed and Sealed this

Twenty-sixth Day of August, 2003

JAMES E. ROGAN
*Director of the United States Patent and Trademark Office*